United States Patent [19]

Higgins, III

[11] Patent Number: 5,291,062
[45] Date of Patent: Mar. 1, 1994

[54] AREA ARRAY SEMICONDUCTOR DEVICE HAVING A LID WITH FUNCTIONAL CONTACTS

[75] Inventor: Leo M. Higgins, III, Austin, Tex.

[73] Assignee: Motorola, Inc., Schaumburg, Ill.

[21] Appl. No.: 24,124

[22] Filed: Mar. 1, 1993

[51] Int. Cl.⁵ .................... A01L 23/02; A01L 23/12
[52] U.S. Cl. .................... 257/698; 257/702; 257/693
[58] Field of Search .............. 257/779, 780, 781, 704, 257/693, 698, 694, 695, 696, 697, 702; 174/52.4

[56] References Cited

U.S. pATENT DOCUMENTS

| | | | |
|---|---|---|---|
| 4,338,621 | 7/1982 | Braun | 357/74 |
| 4,342,069 | 7/1982 | Link | 361/401 |
| 4,513,355 | 4/1985 | Schroeder | 257/698 |
| 4,691,225 | 9/1987 | Murakami et al. | 257/693 |
| 4,727,410 | 2/1988 | Higgins, III | 357/74 |
| 4,803,546 | 2/1989 | Sugimoto et al. | 357/81 |
| 4,862,231 | 8/1989 | Abend | 357/19 |
| 5,041,899 | 8/1991 | Oku et al. | 257/693 |
| 5,089,881 | 2/1992 | Panicker | 357/80 |
| 5,097,318 | 3/1992 | Tanaka et al. | 257/704 |
| 5,126,818 | 6/1992 | Takami et al. | 357/65 |
| 5,128,831 | 7/1992 | Fox et al. | 361/696 |
| 5,191,511 | 3/1993 | Sawaya | 361/383 |

FOREIGN PATENT DOCUMENTS

| | | | |
|---|---|---|---|
| 61-174752 | 8/1986 | Japan | 257/697 |
| 3-108743 | 5/1991 | Japan | 257/704 |

*Primary Examiner*—Sheila V. Clark
*Attorney, Agent, or Firm*—Minh-Hien N. Clark

[57] ABSTRACT

An area array semiconductor device (10) having a lid with functional I/O contacts can be manufactured. In one embodiment, a semiconductor die (12) is mounted in a die cavity (16) of a substrate (14). A plurality of wire bonds (20) connect the die to conductive traces (18) on a surface of the substrate. A lid (22) having conductive traces (26) on an inner surface, which are electrically interconnected to an area array of contact pads (28) on an outer surface by a plurality of plated through-holes (30), is attached to the substrate with an anisotropic conductive adhesive (32). The adhesive electrically connects the conductive traces on the substrate to the conductive traces on the lid. A plurality of conductive pins (34) are attached to the area array of contact pads to provide one method of mounting the device to a board.

21 Claims, 2 Drawing Sheets

AREA ARRAY SEMICONDUCTOR DEVICE HAVING A LID WITH FUNCTIONAL CONTACTS

FIELD OF THE INVENTION

This invention relates to a semiconductor device in general, and more specifically to an area array semiconductor device with a lid having functional contact pads.

BACKGROUND OF THE INVENTION

Semiconductor devices are used in the electronics industry in various types of consumer products, such as pagers, phones, portable equipment, computers, and the like. It is desirable to minimize the size of these semiconductor devices because board space can be limited. However, for a semiconductor device having increased functionality which results in high input/output (I/O) connections, the resulting packaged device can be larger than desired. One approach to packaging devices having high I/O connections has been a package having an area array configuration, which allows higher density connections than a peripheral array configuration. Examples of area array devices are pin grid array (PGA) and ball grid array (BGA) packages. PGAs feature a multiplicity of plug-in pins arranged in an array or matrix format on the bottom of a substrate. This type of package is typically ceramic and is not a surface mount package, but PGAs can be made with printed wiring boards (PWB), such as epoxy-glass. PGAs can be surface mounted in some configurations, but reliable assembly can be complicated by variations in surface flatness of the substrate being contacted by the pins in the surface mount assembly process.

A typical BGA 120 is illustrated in FIG. 1 as prior art. BGA 120 has a semiconductor die 12 mounted to a PWB substrate 122. Die 12 is electrically connected to conductive traces (not illustrated) on the PWB substrate 122 with a plurality of wire bonds 20. A plastic encapsulant 124 encapsulates the semiconductor die 12 and wire bonds 20 on the top surface of the PWB substrate 122. The wire bonds 20 and the conductive traces (not illustrated) are electrically connected with vias or plated through-holes 140 and 141. Plated through-hole 141 is often bisected when excised from the panel in which it is manufactured as illustrated in FIG. 1. BGA 120 has a plurality of solder balls 126 arranged in an array format along a bottom surface of the PWB substrate 122. BGA 120 is a surface mount device which is more desirable in many applications. A disadvantage to a BGA is that it is usually assembled on a PWB with a junction-side-up die orientation, wherein the active surface of the die is facing away from the PWB. This orientation is thermally inefficient. The heat generated by the device usually has to be dissipated into the board since the thermal resistance of encapsulant 124 is typically too high.

In some cases, the solder connections under the die area of a junction side up BGA are used for thermal dissipation. In other instances, signal, power, or ground connections can be made underneath this die area if the substrate is multilayered. This reduces the thermal performance of the package. If all the I/O contact area under the die region is used for thermal dissipation, then the signal I/Os which could have been connected under the die must be placed on another row of contact pads in the BGA I/O matrix. This added row causes an increase in package size which is not desirable.

It is preferable to design a package with a die down (or junction side down) configuration so that the heat generated during device operation can be dissipated into the ambient environment. Additionally, a heat sink may be attached to the backside of the package to provide a direct heat flow path away from the device and the PWB. Such a package is illustrated in FIG. 2 as prior art. In FIG. 2, BGA 130 is in a die down configuration, wherein the semiconductor die 12 is mounted to a copper plane 134 that is laminated to a PWB substrate 132. PWB substrate 132 has a cavity to accommodate the die 12. Again, wire bonds 20 electrically connect the die 12 to the substrate 132. A plastic encapsulant 124 encapsulates the die 12 and the wire bonds 20 on a bottom surface of the PWB substrate 132. A plurality of solder balls 126 is arranged in an array format on the bottom surface of the PWB substrate 132. However, because BGA 130 is in a die down configuration, the area underneath the die cannot be used for electrical signal, power, or ground connections. Thus, in an effort to improve the thermal performance of the device 130, the size of the substrate must be increased to accommodate the routing of traces for solder ball connections.

It is desirable to package a semiconductor die using an area array configuration in which an entire surface of the packaged device can be used for I/O connections without degrading thermal management of the device.

SUMMARY OF THE INVENTION

This invention provides an area array semiconductor device having a substrate, a semiconductor die, and a lid. The substrate has a first plurality of conductive traces and a die cavity. The semiconductor die has an active surface and an inactive surface, wherein the inactive surface is bonded to the substrate in the die cavity. A plurality of electrical connections connect the active surface of the semiconductor die to the first plurality of conductive traces. The lid covers the semiconductor die and a portion of the substrate. The lid has a second plurality of conductive traces on a mating surface with the substrate. An anisotropic conductive adhesive affixes the lid to the substrate and electrically connects the first plurality of conductive traces to the second plurality of conductive traces. The second plurality of conductive traces is electrically interconnected to an area array of contact pads on an outer surface of the lid.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 3:
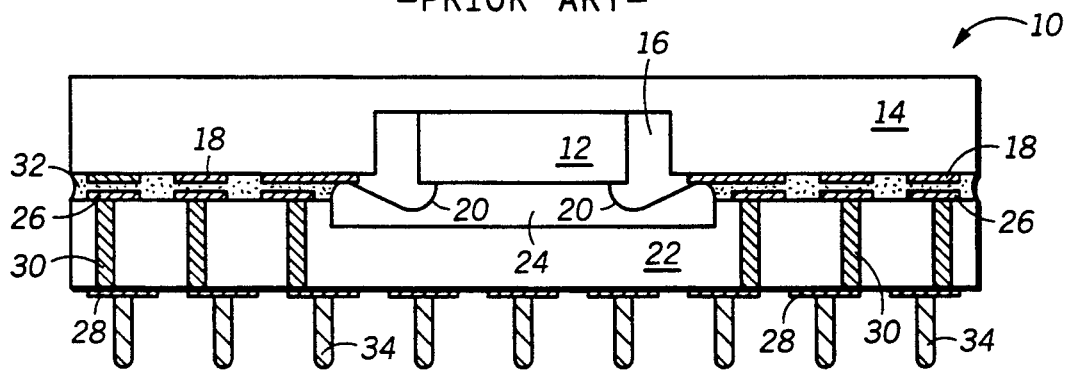
FIG. 3 illustrates, in a cross-sectional view, an area array semiconductor device in a first embodiment of the invention.

The invention is now discussed in detail with reference to the figures. FIG. 3 illustrates, in a cross-sectional view, an area array semiconductor device 10 in a first embodiment of the invention. Device 10 has a semiconductor die 12 mounted to a substrate 14. Although not limited to these following materials, examples of possible materials that can be used for the substrate are epoxy-glass, polyimide-glass, cyanate ester-glass, bismaleimide-triazine resin (BT resin)-glass, and polytetrafluorethylene-glass. Other organic polymer based materials may also be suitable. Moreover, it is also possible to use a ceramic substrate in conjunction with this first embodiment of the present invention. Substrate 14 has a die cavity 16 in which the semiconductor die 12 is mounted. It should be pointed out that semiconductor die 12 has an active surface and an inactive surface, wherein the inactive surface is affixed to the substrate 14. In this manner, the device 10 is in a die down or junction side down configuration for good thermal management. The semiconductor die 12 can be bonded to the substrate 14 with a conventional die attach material (not illustrated). An optional copper plane can be added to the outer surface of the substrate for increased heat dissipation. This plane can be at ground or power potential. In this case, the inactive surface of the semiconductor die would be mounted directly to the copper plane with a thermally conductive adhesive. Typically, this copper plane would be laminated onto the substrate during the manufacturing of the substrate. The region beneath the die can be populated with thermal vias if it is not desired to directly bond to an attached copper plane. The vias will conduct heat into a backside copper plane.

Substrate 14 also has a plurality of conductive traces 18 on an inner surface of the substrate 14. It should be noted that the traces 18 shown are only intended to be representative because the actual pattern of conductive traces will depend upon the functions of the semiconductor die mounted on the substrate. The active surface of the semiconductor die 12 is connected to the plurality of conductive traces 18 with a plurality of wire bonds 20 to establish electrical connections between the die 12 and the substrate 14. Techniques of wire bonding are well known in the art. In this embodiment, it is envisioned that the electrical routing of the traces is simple enough that all of the traces can be routed on a surface of the substrate, where multilayer technology and plated through holes are not required to achieve the routing pattern.

Also illustrated in FIG. 3 is a lid 22 that covers the semiconductor die 12 and the substrate 14. Lid 22 should be made of a same material as the substrate 14 for good thermal expansion matching. Lid 22 has a cavity 24 that provides a clearance for the plurality of wire bonds 20. This clearance is needed so that the wire bonds 20 are not damaged by inadvertent contact with the lid. Lid 22 also has a plurality of conductive traces 26 on a mating surface with the substrate 14. Conductive traces 26 are electrically interconnected to an area array of contact pads 28 on an outer surface of the lid 22 by a plurality of plated through-holes 30, which may be filled with solder, conductive epoxy, or other suitable materials. These plated through-holes could be filled vias if lid 22 were ceramic. It is not necessary that the mating surfaces of traces 18 and 26 be in-line with the plated through holes 30. The area array of contact pads 28 uses the entire surface area of the lid, including the area opposing the die 12, for electrical connections which maximizes the density of the contact pads and minimizes the size of the packaged device.

The lid 22 is attached to the substrate 14 with an anisotropic conductive adhesive 32, which electrically connects the plurality of conductive traces 26 on the lid 22 to the plurality of conductive traces 18 on the substrate 14. Anisotropic conductive adhesive 32 is a commercially available product that conducts only in the z-axis, or vertical direction, after being properly cured. Therefore, no shorting occurs between individual traces from each plurality. The lid and substrate must be aligned so that corresponding individual traces on the lid and substrate can be electrically connected in the vertical direction with the anisotropic conductive adhesive 32. Anisotropic conductive adhesive 32 can be applied in either a paste, liquid, or film form.

Additionally illustrated in FIG. 3 is a plurality of conductive pins 34 which are attached to the area array of contact pads 28. Conductive pins 34 are used to interconnect the device 10 to a board (not illustrated) or a next level interconnect by inserting the pins 34 into holes (not illustrated) in the board or by surface mounting the pins to the board surface. An alternative to using conductive pins is to use solder balls, solder columns, or bare pads 28 to make the device a surface mount device.

Figure 1:
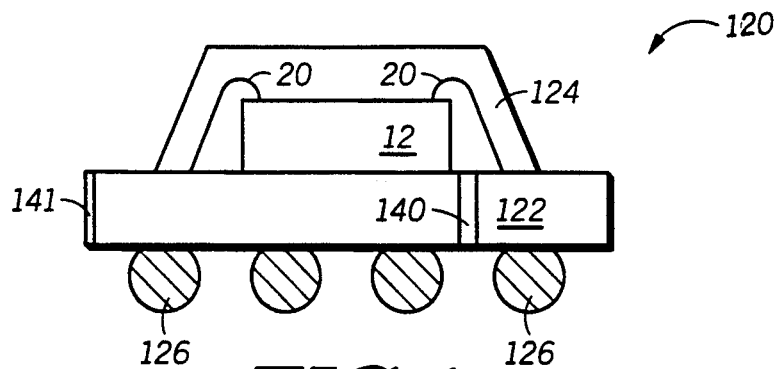
FIG. 1 illustrates, in a cross-sectional view, a junction side up ball grid array as prior art.
Figure 2:
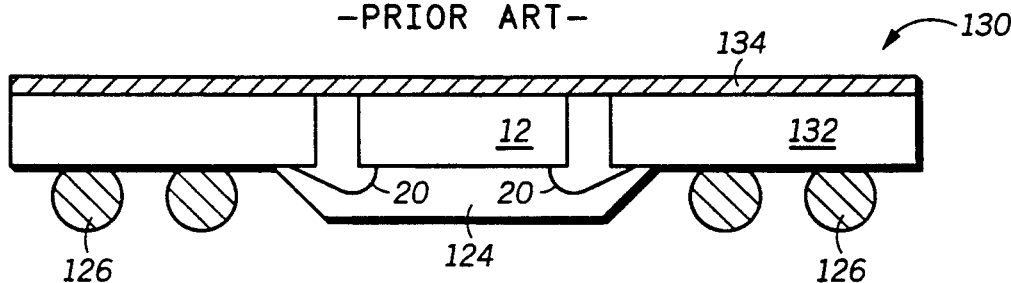
FIG. 2 illustrates, in a cross-sectional view, a junction side down ball grid array as prior art.

An advantage to this first embodiment of the invention is that the semiconductor die can be tested after it is wire bonded to the substrate by probing contact pads on the conductive traces 18 on the inner surface of the substrate. If the die fails test, then further assembly is not done and unnecessary packaging cost is eliminated. Another advantage to this embodiment is the low cost of the substrate. Substrates with a single conductor plane are typically much cheaper to manufacture than a substrate requiring multilayer technology. An additional advantage to this embodiment is the size reduction of the packaged device because the entire surface area of the lid can be used to provide interconnections to desired functions, such as signals, power, and ground. The prior art configuration in FIG. 1 forces a compromise since improved thermal management requires that the contacts opposing the die be used for thermal vias. Typically, these vias are connected to ground or power planes in the board or next level interconnect. This precludes the use of the contacts for signal connections. This embodiment of the invention decouples thermal management from the contacts opposing the die, allowing their use for signal, power, or ground connections. By having the functional contact pads on the lid and being able to use the entire surface area of the lid, a size reduction of 30% to 40% is possible over a conventional die down BGA (refer to FIG. 2).

The remaining figures which illustrate other embodiments of the present invention incorporate many of the same or similar elements as those described above in reference to FIG. 3. Therefore, like reference numerals designate identical or corresponding parts in the following figures.

Figure 4:
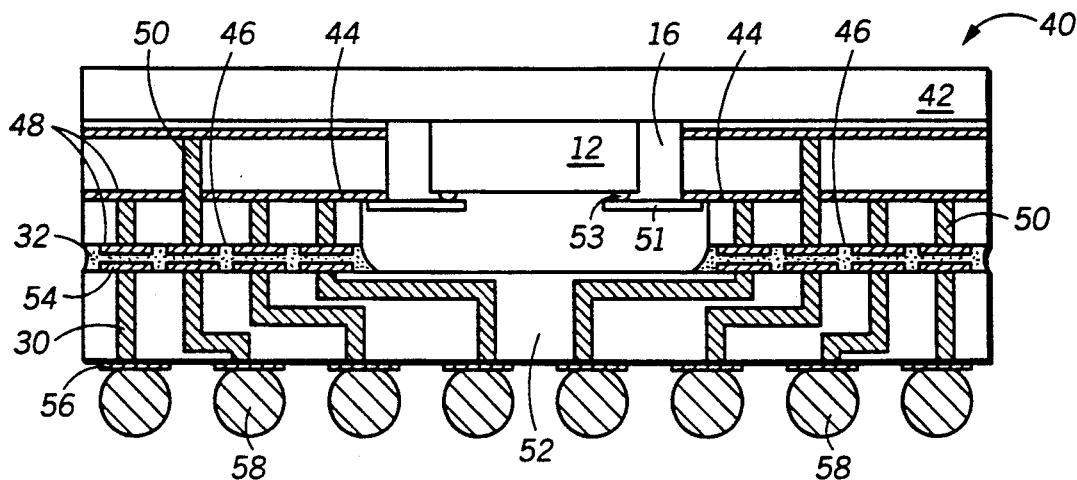
FIG. 4 illustrates, in a cross-sectional view showing internal interconnect planes, an area array semiconductor device in a second embodiment of the invention.

FIG. 4 illustrates, in a cross-sectional view, an area array semiconductor device 40 in accordance with a second embodiment of the invention. Device 40 has a semiconductor die 12 mounted to a substrate 42. Substrate 42 is a multilayer construction with several levels of metal in the substrate. The same materials previously discussed for substrate 14 of FIG. 3 can be used for substrate 42. An optional copper plane can be added to the outer surface of the substrate permitting die attach directly to the copper plane for increased heat dissipation. Substrate 42 has a bonding shelf 44 and a lid contact shelf 46 in addition to die cavity 16. Substrate 42 also has a plurality of conductive traces 48 that extends from the bonding shelf 44 to the lid contact shelf 46. A plurality of plated through-holes 50 connect the traces from one level to another in the substrate 42. In the case of a ceramic substrate, filled vias would connect traces from one level to another. As illustrated in FIG. 4, the active surface of the semiconductor die 12 is TAB bonded to the bonding shelf 44 to electrically connect the die 12 to the traces on the lid contact shelf 46. In the case of TAB bonding, a plurality of TAB leads 51 is bonded to the active surface of the die 12 with a plurality of bumps 53. Bumps 53, which are typically gold, can be either pre-bumped on the die or on the TAB tape. It is also possible to do bumpless TAB bonding. The TAB leads 51 are bonded to the conductive traces 48. Alternatively, wire bonds could be used to form the electrical connections between the die and the substrate.

As the name implies, the lid contact shelf 46 makes contact with a lid 52. Lid 52 covers the semiconductor die 12 and the substrate 42. Lid 52 should be made of a same material as the substrate 42 for good thermal expansion matching. Lid 52 does not have a cavity because the substrate is multi-tiered so that a clearance for the wire bonds in inherently designed into the substrate 42. However, a cavity can be designed into the lid if so desired. Lid 52 has plurality of conductive traces 54 on a surface which mates with the substrate 42. Conductive traces 54 are electrically interconnected to an area array of contact pads 56 on an outer surface of the lid 52 by a plurality of plated through-holes 30. Area array of contact pads 56 uses the entire surface area of the lid, including the area opposing the die, for signal, power, and ground connections which maximizes the density of the contact pads and minimizes the size of the packaged device.

The lid 52 is attached to the substrate 42 with an anisotropic conductive adhesive 32, which electrically connects the plurality of conductive traces 54 on the lid 52 to the plurality of conductive traces 48 on the substrate 42. The lid and substrate must be aligned so that corresponding individual traces on the lid and substrate can be electrically connected in the vertical direction with the anisotropic conductive adhesive 32.

Additionally illustrated in FIG. 4 is a plurality of solder balls 58 which are attached to the area array of contact pads 56. Solder balls 58 are used to mount the device 40 to a board (not illustrated) or a next level interconnect, wherein the solder balls 58 and/or solder on the board would be reflowed to make surface mount solder joints. It is possible to use conductive pins, as previously illustrated in FIG. 3, or solder columns instead of solder balls for the external electrical connections. Bare contact pads 56 may also be used. The solder balls 58 can be attached to the area array of contact pads 56 on the lid 52 before or after the lid 52 is affixed to the substrate 42. An advantage of doing the solder ball attachment prior to the lid sealing process is that solder reflowing temperatures are typically much higher than an adhesive sealing temperature. Therefore, by attaching the solder balls 58 to the lid 52 before it is attached to the substrate 42, the semiconductor die 12 is not subjected to the high solder reflow processing temperature.

This second embodiment of the present invention has the same advantages previously set forth for the first embodiment, except that this second embodiment is higher in cost than the first embodiment. The reason being that a multilayer substrate is needed to effect the routing of the conductive traces from one shelf to another. However, this embodiment allows more complex semiconductor dice to be packaged in this manner. Devices having a very high number of I/O can be accommodated with this design since the multilayer technology permits complex routing.

Figure 5:
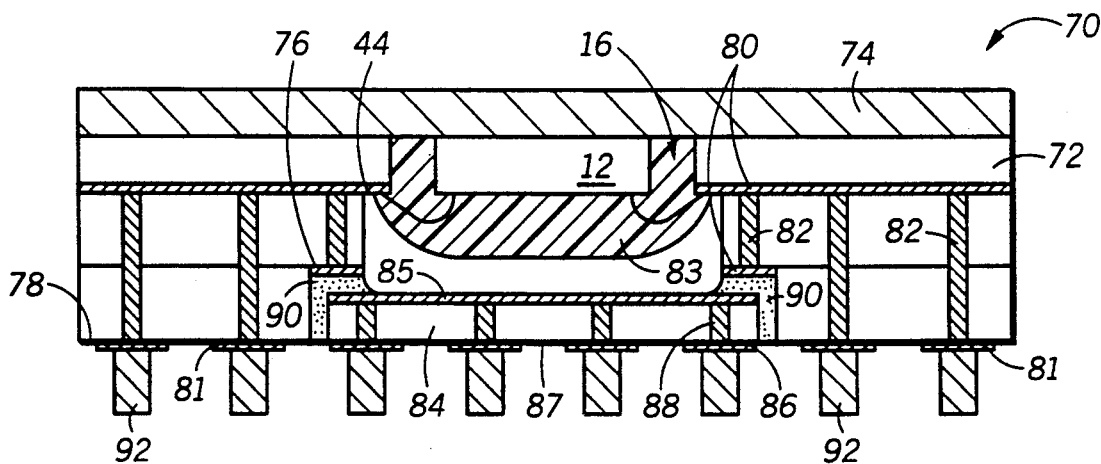
FIG. 5 illustrates, in a cross-sectional view, an area array semiconductor device in a third embodiment of the invention.

FIG. 5 illustrates, in a cross-sectional view, an area array semiconductor device 70 in accordance with a third embodiment of the present invention. Device 70 has semiconductor die 12 mounted to a substrate 72 in die cavity 16. In this illustration, substrate 72 has a copper plane 74 on an outer surface of the substrate for enhanced thermal dissipation. Copper plane 74 is typically laminated onto the substrate base material, such as polyimide-glass, during the manufacturing of the substrate. Similar to substrate 42 of FIG. 4, substrate 72 is a multilayer construction with several levels of metal in the substrate. Again, the same materials previously discussed for substrate 14 of FIG. 3 can be used for substrate 72. Substrate 72 has bonding shelf 44, a lid contact shelf 76, and an outer surface 78. Substrate 72 also has a plurality of conductive traces 80 that extends from the bonding shelf 44 to the lid contact shelf 76 and the outer surface 78. The conductive traces on the outer surface 78 form an area array of contact pads 81. A plurality of plated through-holes 82 connect the traces from one level to another in the substrate 72 and to the area array of contact pads 81 on the outer surface 78 of the substrate. Thus, the plurality of wire bonds 20 extending from the active surface of the semiconductor die 12 to the bonding shelf 44 serves to electrically connect the die 12 to the traces on the lid contact shelf 76 as well as the area array of contact pads 81 on the outer surface 78 of the substrate 72.

Also illustrated in FIG. 5 is an encapsulant 83 covering the semiconductor die 12 and the plurality of wire bonds 20. Encapsulant 83 can be any number of polymeric materials, such as epoxy resins, polyimides, polyurethanes, and silicone rubbers. Other materials may also be suitable. Although not a requirement to practice this embodiment of the invention, the encapsulant 83 can provide some additional protection to the semiconductor die 12 from moisture and contaminants leading to corrosion of the die. An encapsulant can also be used in conjunction with the first two embodiments of the invention. The encapsulant need not fully cover the die and wires with a thick coating as illustrated in FIG. 5. A thin coating which covers the active surface of the die and contact region where the wires join the die and the substrate is also possible.

In this third embodiment, the lid contact shelf 76 also makes contact with a lid 84. Lid 84 covers the semiconductor die 12 and a portion of the substrate 72, specifically, the lid contact shelf 76. Lid 84 should be made of a material that is the same as the substrate 72 for good thermal expansion matching. As in the case of the second embodiment, lid 84 does not have a cavity because the substrate is multi-tiered so that a clearance for the wire bonds is inherently designed into the substrate 72.

However, a cavity can be designed into the lid if so desired. Lid 84 has plurality of conductive traces 85 on a mating surface with the substrate 72. Conductive traces 85 are illustrated as a continuous layer in FIG. 5 for ease of illustration only, and it should be understood that the traces are not shorted together but are individual conductors. Conductive traces 85 are electrically interconnected to an area array of contact pads 86 on an outer surface 87 of the lid 84 by a plurality of plated through-holes 88. Having an area array of contact pads 86 on the surface area 87 of the lid 84 allows usage of the area opposing the die for electrical connections which maximizes the density of the contact pads, which minimizes the size of the packaged device.

The lid 84 is attached to the lid contact shelf 76 of the substrate 72 with an anisotropic conductive adhesive 90, which electrically connects the plurality of conductive traces 85 on the lid 84 to the plurality of conductive traces 80 on the lid contact shelf 76 of substrate 72. The lid and lid contact shelf must be aligned so that corresponding individual traces on the lid and lid contact shelf can be electrically connected in the vertical direction with the anisotropic conductive adhesive 90. Once lid 84 is affixed to the substrate 72, the outer surface 87 of lid 84 is substantially coplanar with the outer surface 78 of the substrate 72. Having a substantially planar outer surface facilitates subsequent attachment of device 70 to a board (not illustrated) or a next level interconnect. The area array of contact pads 81 on the substrate 72 surrounds the area array of contact pads 86 on the lid, fully utilizing the available surface area of the device 70 for signal, power, and ground connections.

Additionally illustrated in FIG. 5 is a plurality of solder columns 92 which are attached to both area arrays of contact pads 81 and 86. Solder columns 92 are used to mount the device 70 to a board (not shown) or a next level interconnect, wherein the solder columns 92 would be joined to the board or next level interconnect with molten solder, making surface joints. It is possible to use conductive pins, as previously illustrated in FIG. 3, or solder balls as previously illustrated in FIG. 4, instead of solder columns for the external electrical connections. Bare contact pads 81 and 86 may also be used, wherein a conductive adhesive or solder could be used to connect the contact pads 81 and 86 to the next level interconnect. Again, the solder columns can be attached to the lid before or after the lid is affixed to the substrate. However, since solder columns have to be attached to the area array of contact pads 81 on the substrate as well as the area array of contact pads 86 on the lid, it may be preferable to attach the solder columns in one process step after the lid 84 has been affixed to the substrate.

This third embodiment of the present invention has the same advantages previously set forth for the first embodiment, except that this third embodiment is higher in cost than the first embodiment, because a multilayer substrate is needed to effect the routing of the conductive traces from one shelf to another. However, this embodiment allows more complex semiconductor dice to be packaged in this manner. Devices having a very high number of I/O can be accommodated with this design where the routing of electrical traces gets so complex that a multilayer technology is required.

Figure 6:
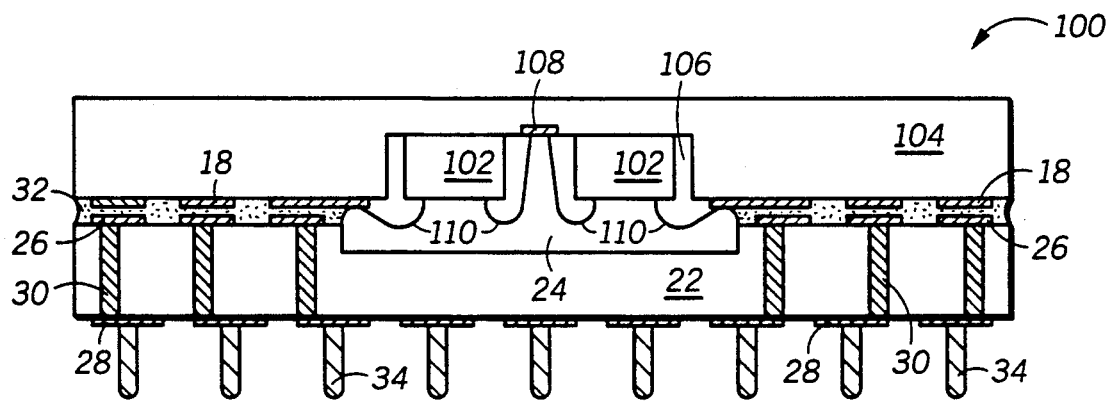
FIG. 6 and 7 illustrate, in a cross-sectional view, multichip modules having a lid with functional contact pads in alternative embodiments of the invention.
Figure 7:
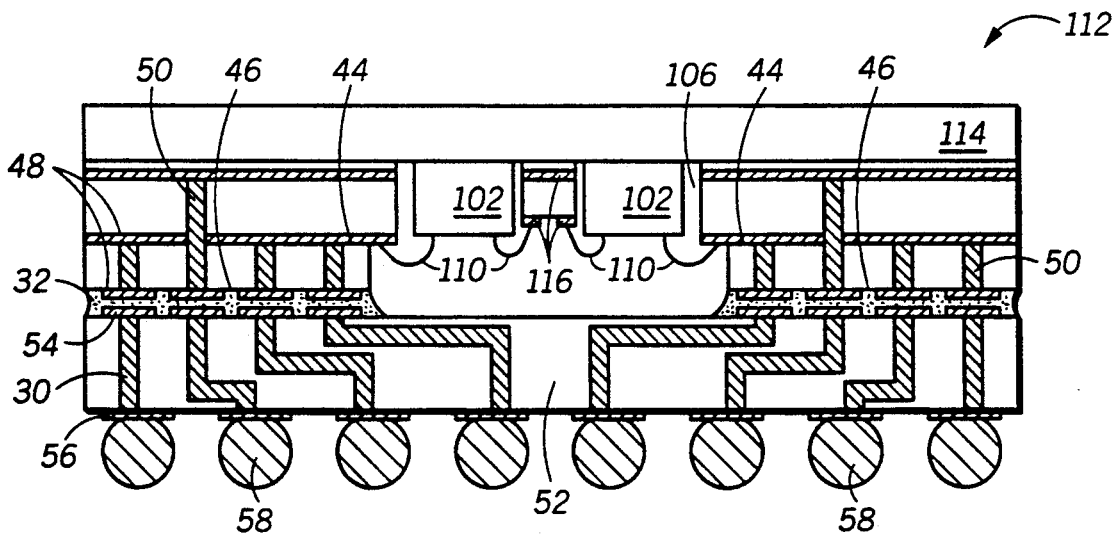

Multichip modules can also be fabricated using extensions of the embodiments illustrated in FIGS. 3-5. Illustrated in FIGS. 6 and 7 are multichip modules having a lid with functional contact pads. In FIG. 6, multichip module 100 is illustrated to have a plurality of semiconductor dice 102 mounted to a substrate 104. Substrate 104 is substantially similar to substrate 14 of FIG. 3 in terms of construction and materials. Substrate 104 has a die cavity 106 in which the semiconductor dice 102 are mounted. Alternatively, the substrate could have multiple die cavities for mouting a multiplicity of dice. The size of die cavity 106 may vary depending on the size and number of the dice 102. Substrate 104 also has metallization 108 in the cavity which allows the semiconductor dice to be electrically interconnected by a plurality of wire bonds 110. The wire bonds 110 also electrically connect the dice 102 to the substrate 104. Alternatively, a TAB tape could also be used as a die interconnect method in device 100. The remaining construction of multichip module 100 is substantially the same as that of the device 10 of FIG. 3.

FIG. 7 illustrates a multichip module 112 utilizing a multilayer substrate 114. Substrate 114 has metallization 114 in the die cavity 106 to allow a plurality of semiconductor dice 102 to be interconnected. The metallization 114 can be routed to different conductor planes in the substrate so that the dice do not have to be interconnected in-line, using the same bonding pads.

Although not specifically illustrated, it should be apparent that a substrate substantially similar to substrate 72 of FIG. 5 can also be used to manufacture a multichip module. Moreover, any of the multichip modules can have pins, solder balls, solder columns, or bare contact pads as a means for connecting to a next level interconnect. Furthermore, any of the multichip module substrates may also have a copper conductor plane laminated onto the backside of the substrate for enhanced thermal dissipation. Alternatively, the multichip module substrates could have separate die cavities to accommodate individual semiconductor dice, and individual copper planes can be laminated to the back of the substrate for each cavity. The routing of the conductive traces could interconnect selective inputs or outputs of the dice where desired. Additionally, the semiconductor dice can be further protected with an encapsulant covering the dice.

The foregoing description and illustrations contained herein demonstrate many of the advantages associated with the present invention. In particular, it has been revealed that an area array semiconductor device that is thermally efficient is possible. Furthermore, embodiments of the area array semiconductor device allows an entire surface area of a package body to be used for electrical signal connections to minimize the size of the packaged semiconductor device. The size of the substrate can be reduced approximately 30% to 40% from conventional die down BGAs. The invention also allows flexibility in terms of the external electrical connections, wherein the device can be mounted using either surface mounting technology or a through-hole mounting technology. An optional heat spreader in the form of a laminated copper plane can be used in conjunction with every embodiment of the device for increased thermal management of high powered devices. An encapsulant can be used to provide added protection for the die by reducing the risk of damage from moisture and contaminants in any of the embodiments.

Thus it is apparent that there has been provided, in accordance with the invention, an area array semiconductor device having a functional lid which overcomes the problems associated with the prior art devices. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the pattern of conductive traces on a substrate is not restricted by the present invention. The conductive trace pattern is dependent upon the types and configurations of the various semiconductor die used in a device. In addition, the present invention is not limited to any specific number or kind of semiconductor die used. The substrate may be enlarged to have multiple die cavities to accommodate multiple semiconductor dice. Furthermore, other methods than that described for electrically connecting the die to the substrate are possible, such as flip-chip mounting the die to the substrate. Thus it is intended to encompass within the invention all such variations and modifications falling within the scope of the appended claims.

I claim:

1. An area array semiconductor device comprising:
   a polymeric substrate having a first plurality of conductive traces and a die cavity;
   a semiconductor die having an active surface and an inactive surface, wherein the inactive surface is bonded to the substrate in the die cavity;
   a plurality of electrical connections connecting the active surface of the semiconductor die to the first plurality of conductive traces; and
   a polymeric lid covering the semiconductor die and a portion of the substrate, wherein the lid has a second plurality of conductive traces on a first surface which is electrically interconnected to an area array of contact pads on a second surface, wherein the area array of contact pads substantially populates the second surface; and
   an anisotropic z-axis conductive adhesive which seals the lid to the substrate and electrically connects the second plurality of conductive traces to the first plurality of conductive traces.

2. The device of claim 1, wherein the second plurality of conductive traces is electrically interconnected to the area array of contact pads by a plurality of plated through-holes.

3. The device of claim 1 further comprising an external interconnect component selected from a group consisting of:
   a plurality of solder balls attached to the area array of contact pads;
   a plurality of conductive pins attached to the area array of contact pads; and
   a plurality of solder columns attached to the area array of contact pads;
   wherein the external interconnect component provides an external electrical connection for the device.

4. The device of claim 1, wherein the substrate and the lid comprise a material selected from a group consisting of: epoxy-glass, polyimide-glass, cyanate ester-glass, bismaleimide-triazine resin-glass, and polytetrafluorethylene-glass.

5. The device of claim 1, wherein the substrate has a copper plane affixed to a surface of the substrate and wherein the inactive surface of the semiconductor die is bonded to the copper plane with a thermally conductive adhesive.

6. The device of claim 1, wherein the plurality of electrical connections comprises a connection selected from a group consisting of: a wire bond and a tape automated bond.

7. The device of claim 1, wherein the substrate has a bonding shelf to which the plurality of electrical connections are made from the active surface of the semiconductor die.

8. The device of claim 7, wherein the substrate has a lid contact shelf having a portion of the first plurality of conductive traces, the portion of the first plurality of conductive traces being electrically connected to the second plurality of conductive traces on the lid with an anisotropic z-axis conductive adhesive.

9. The device of claim 8, wherein the substrate has a second area array of contact pads which is substantially coplanar with the first area array of contact pads on the lid, the second area array of contact pads surrounding the first area array of contact pads.

10. An area array semiconductor device comprising:
    a polymeric substrate having a first plurality of conductive traces on a first surface and a die cavity;
    a semiconductor die having an active surface and an inactive surface, wherein the inactive surface is bonded to the substrate in the die cavity;
    a plurality of electrical connections connecting the active surface of the semiconductor die to the first plurality of conductive traces, defining a contact area; and
    a polymeric lid covering the semiconductor die and the substrate, wherein the lid has a cavity of an area at least as large as the contact area and the die cavity to provide a clearance for the semiconductor die and the plurality of electrical connections, the lid having a second plurality of conductive traces on a second surface which is electrically interconnected to an area array of contact pads on a third surface, wherein the area array of contact pads substantially populates the third surface; and
    an anisotropic z-axis conductive adhesive which seals the lid to the substrate and electrically connects the second plurality of conductive traces on the lid to the first plurality of conductive traces on the substrate.

11. The device of claim 10 further comprising an external interconnect component selected from a group consisting of:
    a plurality of solder balls attached to the area array of contact pads;
    a plurality of conductive pins attached to the area array of contact pads; and
    a plurality of solder columns attached to the area array of contact pads;
    wherein the external interconnect component provides an external electrical connection for the device.

12. The device of claim 10, wherein the substrate and the lid comprise a material selected from a group consisting of: epoxy-glass, polyimide-glass, cyanate ester-glass, bismaleimide-triazine resin-glass, and polytetrafluorethylene-glass.

13. The device of claim 10, wherein the substrate has a copper plane affixed to a second surface of the substrate and wherein the inactive surface of the semiconductor die is bonded to the copper plane with a thermally conductive adhesive.

14. The device of claim 10, wherein the plurality of electrical connections comprises a connection selected from a group consisting of: a wire bond and a tape automated bond.

15. An area array semiconductor device comprising:

a polymeric substrate having a bonding shelf, a lid contact shelf, a die cavity, and a first plurality of conductive traces which extends from the bonding shelf to the lid contact shelf;

a semiconductor die having an active surface and an inactive surface, wherein the inactive surface is bonded to the substrate in the die cavity;

a plurality of electrical connections connecting the active surface of the semiconductor die to the first plurality of conductive traces on the bonding shelf; and a polymeric lid covering the semiconductor die and a portion of the substrate, the lid having a second plurality of conductive traces on a first surface which is electrically interconnected to an area array of contact pads on a second surface, wherein the area array of contact pads substantially populates the second surface; and an anisotropic z-axis conductive adhesive which seals the lid to the substrate and electrically connects the second plurality of conductive traces on the lid to the first plurality of conductive traces on the lid contact shelf of the substrate.

16. The device of claim 15, wherein the substrate has a second area array of contact pads which is substantially coplanar with the first area array of contact pads on the lid, the second area array of contact pads surrounding the first area array of contact pads.

17. The device of claim 15 further comprising an external interconnect component selected from a group consisting of:

a plurality of solder balls attached to the area array of contact pads;

a plurality of conductive pins attached to the area array of contact pads; and a plurality of solder columns attached to the area array of contact pads;

wherein the external interconnect component provides an external electrical connection for the device.

18. The device of claim 15, wherein the substrate and the lid comprise a material selected from a group consisting of: epoxy-glass, polyimide-glass, cyanate ester-glass, bismaleimidetriazine resin-glass, and polytetrafluorethylene-glass.

19. The device of claim 15, wherein the substrate has a copper plane affixed to a surface of the substrate and wherein the inactive surface of the semiconductor die is bonded to the copper plane with a thermally conductive adhesive.

20. The device of claim 15 further comprising:

an encapsulant covering the active surface of the semiconductor die and a portion of the plurality of electrical connections.

21. The device of claim 15, wherein the plurality of electrical connections comprises a connection selected from a group consisting of: a wire bond and a tape automated bond.

* * * * *